United States Patent
Handy et al.

(10) Patent No.: US 10,972,087 B2
(45) Date of Patent: Apr. 6, 2021

(54) SYSTEM AND METHOD FOR LIMTING CURRENTS IN A POWER DISTRIBUTION SYSTEM

(71) Applicant: GE Aviation Systems Limited, Gloucestershire (GB)

(72) Inventors: Peter James Handy, Cheltenham (GB); Peter Michael Tyler, Cheltenham (GB)

(73) Assignee: GE Aviation Systems Limited, Gloucestershire (GB)

( * ) Notice: Subject to any disclaimer, the term of this patent is extended or adjusted under 35 U.S.C. 154(b) by 206 days.

(21) Appl. No.: 15/986,056

(22) Filed: May 22, 2018

(65) Prior Publication Data

US 2018/0375505 A1 Dec. 27, 2018

(30) Foreign Application Priority Data

Jun. 26, 2017 (GB) ..................................... 1710161

(51) Int. Cl.
| | |
|---|---|
| *B60L 1/00* | (2006.01) |
| *H03K 17/082* | (2006.01) |
| *H02H 9/02* | (2006.01) |
| *H02H 1/00* | (2006.01) |
| *H02J 1/10* | (2006.01) |
| *H03K 17/16* | (2006.01) |
| *H03K 17/10* | (2006.01) |
| *H02H 3/02* | (2006.01) |

(Continued)

(52) U.S. Cl.
CPC ......... *H03K 17/082* (2013.01); *H02H 1/0007* (2013.01); *H02H 3/025* (2013.01); *H02H 9/02* (2013.01); *H02H 9/025* (2013.01); *H02J 1/06* (2013.01); *H02J 1/10* (2013.01); *H02J 1/14* (2013.01); *H03K 17/10* (2013.01); *H03K 17/16* (2013.01); *B64D 2221/00* (2013.01)

(58) Field of Classification Search
CPC .................................................... H03K 17/082
USPC ........................................................... 307/9.1
See application file for complete search history.

(56) References Cited

U.S. PATENT DOCUMENTS

| | | |
|---|---|---|
| 7,747,879 B2 | 6/2010 | Tofigh et al. |
| 8,536,730 B2 | 9/2013 | Rozman et al. |

(Continued)

FOREIGN PATENT DOCUMENTS

| | | |
|---|---|---|
| CN | 101588124 A | 11/2009 |
| CN | 201805362 U | 4/2011 |

(Continued)

OTHER PUBLICATIONS

Chinese Patent Office, Office Action re Chinese Patent Application No. 201810674101.5, dated Sep. 2, 2019, 8 pages, China.

(Continued)

*Primary Examiner* — Rexford N Barnie
*Assistant Examiner* — Dru Parries
(74) *Attorney, Agent, or Firm* — McGarry Bair PC

(57) ABSTRACT

An apparatus and method for controlling voltage sharing between a set of switching components can include applying power from a current source with a positive lead and a negative lead, closing the set of switching components to connect power from the current source to an electrical load, detecting a set of voltage values for the set of switching components, and controlling a current limiting function of at least one of the set of switching components.

18 Claims, 3 Drawing Sheets

(51) Int. Cl.
H02J 1/14 (2006.01)
H02J 1/06 (2006.01)

(56) References Cited

U.S. PATENT DOCUMENTS

| | | | |
|---|---|---|---|
| 8,716,997 | B2 | 5/2014 | Rao et al. |
| 8,861,162 | B2 | 10/2014 | Fuller et al. |
| 10,027,317 | B2 | 7/2018 | Handy |
| 2013/0208380 | A1* | 8/2013 | Hendricks .............. H02H 3/021 361/56 |
| 2016/0327917 | A1 | 11/2016 | Dickey et al. |
| 2018/0134408 | A1 | 5/2018 | Handy |

FOREIGN PATENT DOCUMENTS

| | | | |
|---|---|---|---|
| CN | 104254956 | A | 12/2014 |
| CN | 204615400 | U | 9/2015 |
| CN | 106443301 | A | 2/2017 |
| CN | 106469907 | A | 3/2017 |
| EP | 3112973 | A1 | 1/2017 |
| GB | 2541451 | A | 2/2017 |
| GB | 2541026 | A | 8/2017 |
| KR | 20160066099 | A * | 6/2016 |

OTHER PUBLICATIONS

Intellectual Property Office; Combined Search and Examination Report in Application No. 1710161.9; dated Dec. 20, 2017; 6 pages; Newport, South Wales.

* cited by examiner

SYSTEM AND METHOD FOR LIMTING CURRENTS IN A POWER DISTRIBUTION SYSTEM

BACKGROUND OF THE INVENTION

Electrical power distribution systems manage the allocation of power from energy sources to electrical loads that consume distributed electrical power. In aircraft, gas turbine engines for propulsion of the aircraft typically provide mechanical energy that ultimately powers a number of different accessories such as generators, starter/generators, permanent magnet alternators (PMA), fuel pumps, and hydraulic pumps, e.g., equipment for functions needed on an aircraft other than propulsion. For example, contemporary aircraft need electrical power for electrical loads related to avionics, motors, and other electric equipment.

Over time, aircraft electrical power source voltages have increased. Aircraft with 14- and 28-volt direct current (VDC) electrical power systems have given way to aircraft with electrical power systems operating at 115 volts alternative current (VAC) and 230 VAC. Presently, aircraft can include one or more electrical power sources that operate at voltages including plus 270 VDC, minus 270 VDC, or a combination thereof. For example, a current wide-body twin-engine commercial jet liner uses an electrical system that is a hybrid voltage system that includes sub-systems operating at voltages of 230 VAC, 115 VAC, 28 VDC along with a bipolar, high voltage, direct current subsystem that includes plus and minus 270 VDC sources.

BRIEF DESCRIPTION OF THE INVENTION

In one aspect, the present disclosure relates to a power distribution system includes a bipolar direct current (DC) source with a positive voltage lead and a negative voltage lead, an electrical load capable of drawing electrical power from the bipolar DC source, a set of switching components configured to selectively connect power from the bipolar DC source to the electrical load by switching between an open state that disconnects power from the bipolar DC source to the electrical load and a closed state that connects power from the bipolar DC source to the electrical load, wherein a first switch is connected to the positive lead of the bipolar DC source and a second switch is connected to the negative lead of the bipolar DC source, and a current limiter module connected with an output of the first switch and the output of the second switch, and adapted to determine a voltage sharing balance between the first switch and the second switch. The first switch is adapted to modify a current limiting characteristic in response to a determination that voltage sharing is unbalanced, or that there is an imbalance between the first switch and the second switch.

In another aspect, the present disclosure relates to a power distribution system for an aircraft includes a bipolar direct current (DC) source with a positive voltage lead and a negative voltage lead, an electrical load capable of drawing electrical power from the bipolar DC source, a set of switching components configured to selectively connect power from the bipolar DC source to the electrical load by switching between an open state that disconnects power from the bipolar DC source to the electrical load and a closed state that connects power from the bipolar DC source to the electrical load, wherein a first switch is connected to the positive lead of the bipolar DC source and a second switch is connected to the negative lead of the bipolar DC source, a first voltage sensor disposed across the first switch and adapted to sense the voltage dropped across the first switch and a second voltage sensor disposed across the second switch and adapted to sense the voltage dropped across the second switch, and a current limiter module adapted to receive the voltage dropped across the first switch and the voltage dropped across the second switch, and adapted to determine a voltage sharing balance between the first switch and the second switch. The first switch is adapted to modify a current limiting characteristic in response to a determination that voltage sharing is unbalanced between the first switch and the second switch.

In yet another aspect, the present disclosure relates to a method of controlling voltage sharing between a set of switching components includes applying power from a bipolar direct current (DC) source with a positive voltage lead and a negative voltage lead, closing the set of switching components to connect power from the bipolar DC source to an electrical load, wherein the set of switching components are in series with the electrical load, detecting a set of voltage values for the set of switching components, determining an imbalance between the voltage values for the set of switching components in a current limiter module, and dynamically controlling a current limiting function of at least one of the set of switching components to correct the imbalance between the voltage values for the set of switching components.

DESCRIPTION OF EMBODIMENTS OF THE INVENTION

Figure 1:
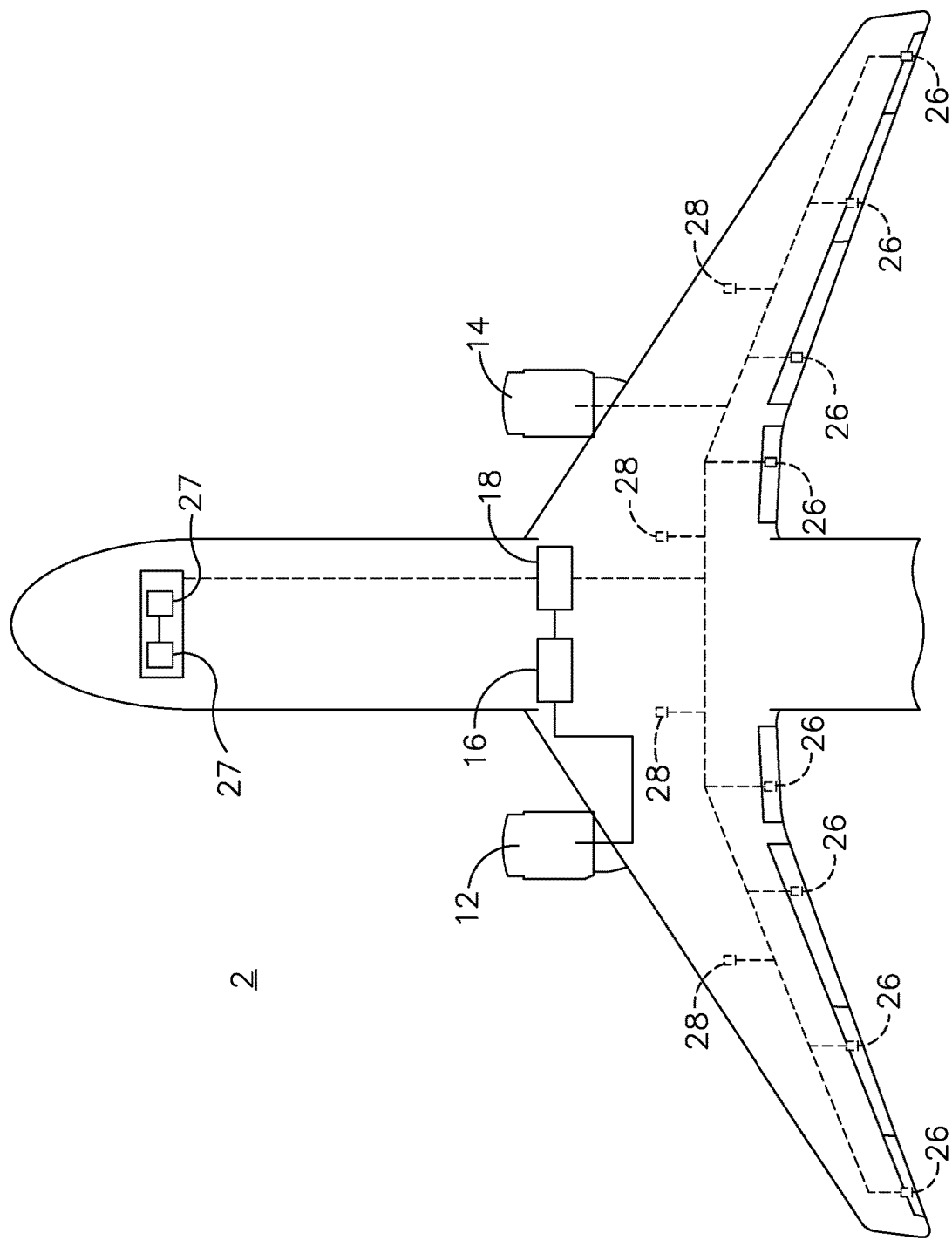
FIG. 1 is a top down schematic view of an aircraft and power distribution system of an aircraft, in accordance with various aspects described herein.

The aspects of the present disclosure are described herein in the context of an aircraft, which enables production of electrical power from an energy source such as a turbine engine, jet fuel, hydrogen, etc. However, it will be understood that while one aspect of the disclosure is shown in an aircraft environment, the disclosure is not so limited and has general application to electrical power distribution systems in non-aircraft applications, such as other mobile applications and non-mobile industrial, commercial, and residential applications. For example, applicable mobile environments can include an aircraft, spacecraft, space-launch vehicle, satellite, locomotive, automobile, etc. Commercial environments can include manufacturing facilities or power generation and distribution facilities or infrastructure.

While "a set of" various elements will be described, it will be understood that "a set" can include any number of the respective elements, including only one element. The use of the terms "proximal" or "proximally" refers to moving in a direction toward another component, or a component being relatively closer to the other as compared to another reference point. Also as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value. Additionally, while terms such as "voltage", "current", and "power" can be used herein, it will be evident to one skilled in the art that these terms can be interchangeable when describing aspects of the electrical circuit, or circuit operations.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

At least some of the aspects of the disclosure provide for bipolar high-voltage electrical power distribution systems, methods and apparatuses that include current limiting capabilities. The bipolar high-voltage electrical power distribution system can be implemented in any electrical circuit environment having a switch. A non-limiting example of an electrical circuit environment that can include at least one solid-state switch, such as a solid-state power controller (SSPC) switching device. One non-limiting example of the SSPC can include a silicon (Si), silicon carbide (SiC), or Gallium Nitride (GaN) based, high power switch. SiC or GaN can be selected based on their solid-state material construction, their ability to handle high voltages and large power levels in smaller and lighter form factors, and their high speed switching ability to perform electrical operations very quickly. Additional switching devices or additional silicon-based power switches can be included.

It will be understood that a bipolar DC power supply or bipolar DC power source as used herein can be defined as a source of direct current electrical power where the output voltage can be set to positive or negative and can source current. It will be understood that high voltage DC as used herein can be defined as electrical energy at voltages high enough to inflict harm on living things. For example, voltages greater than 50 V applied across dry unbroken human skin can cause heart fibrillation if they produce electric currents in body tissues that happen to pass through the chest area. It will be understood that a "fault current," as used herein can include any current as a result of a wiring fault, arc fault, load fault, short circuit fault, ground fault, or the like, due to an inadvertent contact between an energized conductor and another unintended or undesirable conductor, such as a chassis ground.

The exemplary drawings are for purposes of illustration only and the dimensions, positions, order and relative sizes reflected in the drawings attached hereto can vary.

Turning now to FIG. 1, an example top down schematic illustration of an aircraft and electrical power distribution system in accordance with various aspects described herein is shown. An aircraft 2 is illustrated as having at least one gas turbine engine, shown here as a left engine system 12 and a right engine system 14 which can be substantially identical to each other. The aircraft 2 can have any number of engine systems. The left engine system 12 can be coupled to one or more electrical power sources 16 that convert mechanical energy into electrical power. It will be understood that any or all of the engines in an aircraft 2, including the left and right engine systems 12, 14 can be so coupled to one or more bipolar high-voltage DC electrical power sources 16. The bipolar high-voltage DC power source 16 can be coupled to an electrical power distribution system 18 that selectively energizes a set of systems and devices on the aircraft 2 that collectively make up the electrical load. Systems and devices powered by the bipolar high-voltage DC power source 16 by way of the electrical power distribution system 18 can be any system or device on an aircraft capable of drawing an electrical load and include, but are not limited to, flight control actuators 26, localized down-convertors 27 for cockpit displays, environmental control systems 28, or the like.

In the aircraft 2, the operating left and right engine systems 12, 14 provide mechanical energy that can be extracted via a spool, to provide driving force for the bipolar high-voltage DC power source 16. Other power sources can include but are not limited to generators, batteries, fuel cells, backup power sources such as a ram air turbine (RAT), rectifiers for converting one or more AC source inputs to a bipolar high voltage DC source, or the like. The electrical power source 16, in turn, provides the generated power to the electrical loads for the systems and devices 26, 27, 28 for load operations which is distributed by the electrical power distribution system 18.

Figure 2:
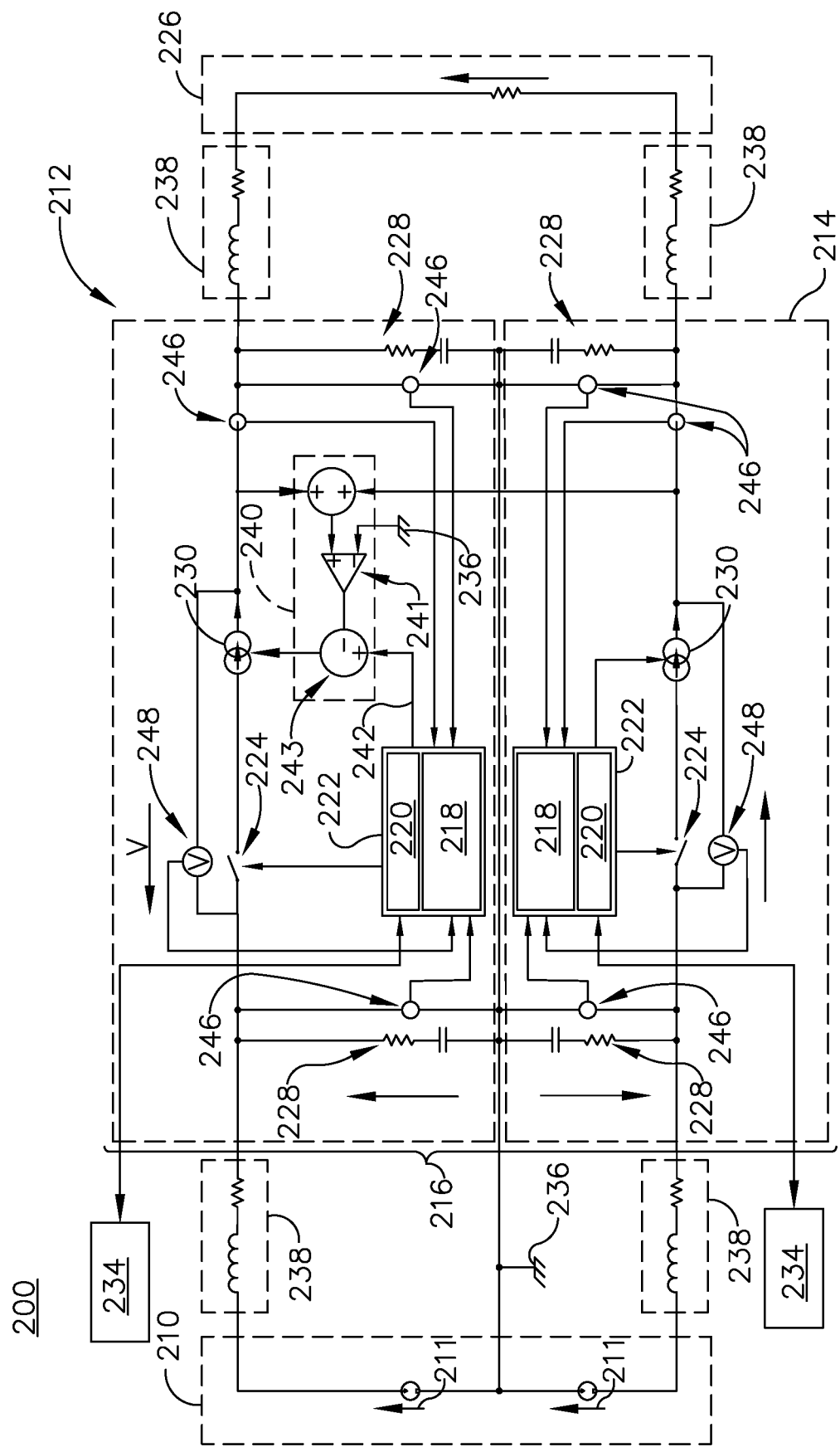
FIG. 2 is an example schematic illustration of an electrical power distribution system with a current limiting component in accordance with various aspects described herein.

Referring now to FIG. 2, a non-limiting schematic illustration of a bipolar high voltage electrical power distribution system 200, such as the power distribution system 18 of FIG. 1, in accordance with various aspects described herein is shown. The power distribution system 200 of FIG. 2 can include a power source 210, shown as two high voltage DC sources 211 each coupled to a chassis ground 236, one by a negative lead and the other by a positive lead. The power source 210 can be further connected with a set of switching components 216. In one non-limiting aspect, the set of switching components 216 can include a first SSPC 212 and a second SSPC 214. The first SSPC 212 is shown connected with the positive side or positive voltage lead of the power source 210 and the second SSPC 214 coupled to the negative side or negative voltage lead of the power source 210. In one non-limiting aspect, the power source 210 and the set of switching components 216 can be connected by way of a current limiting wire 238. The output of set of switching components 216 can be further connected to an electrical loading component, or electrical load 226, capable of drawing electrical power from the power source 210. The connections between set of switching components 216 and the electrical loading component 226 can also include current limiting wiring 238.

The first and second SSPC 212, 214 can include a number of subcomponents and modules for controlling and protecting the set of switching components 216. For instance, in one non-limiting example, the SSPC 212, 214 can include a main solid-state switch 224 that opens or closes to couple, decouple, or selectively connect or disconnect, the electrical load 226 with the power source 210. The main solid-state switch 224 can include a set of protective elements including, but not limited, to a metal-oxide varistor (MOV), a transient voltage suppressor (TVS), or the like. For brevity, the set of protective elements are not illustrated. In another non-limiting example, the SSPC 212, 214 can include one or more snubber circuits 228 across the input of the switch, the output of the switch, or a combination thereof, to suppress voltage spikes and dampen ringing caused by circuit inductance when a switch opens. In yet another non-limiting aspect, the set of SSPCs 212, 214 can include leakage management components or circuits, configured to manage the semiconductor leakage current or voltage when the set of SSPCs 212, 214 are in an opened state.

The SSPC 212, 214 can include a switch control subcomponent 222, including a monitoring module 218 and a controller module 220. The monitoring module 218 can include any monitoring features for sensing or measuring aspects of the respective SSPC 212, 214, including but not limited to, voltage monitoring, current monitoring, temperature monitoring, current limiting, power monitoring, arc fault protection, low fidelity ground fault protection, or the like. The control module 220 can include a processor and memory, and can be configured to operably control the state of the main switch 224 based on inputs from an external communications components 234, the monitoring module 218, a set of executable instructions, or combinations thereof.

Non-limiting aspects of the disclosure can also be included wherein at least one of the set of SSPCs 212, 214 includes a current limiter module 240 to enable, allow for, or operably provide for the limiting of current through at least one of the set of SSPCs 212, 214. As schematically shown, the current limiter module 240 can include a logic device, such as an error amplifier, comparator, or the like, illustrated as an operational amplifier (op-amp) 241. The op-amp 241 can have a negative input terminal electrically connected with the chassis ground 236. The op-amp 241 can further have a positive input terminal connected with a summation of voltages at the output of or across the first SSPC 212 and chassis ground 236 and at the output of or across the second SSPC 214 and chassis ground 236. The summation of voltages across the first SSPC 212 and chassis ground 236 and the second SSPC 214 and chassis ground 236 can be utilized to determine if there is uneven, unbalanced, or whether there is an imbalance in the voltage sharing across the set of SSPCs 216 (i.e. determine whether one SSPC 212, 214 providing or allowing for more power transmission than the other SSPC 212, 214). If a difference exists, that difference will be the output of the summation, representative of the difference, balance, imbalance or unbalance of the voltage sharing, and provided to the positive input terminal of the op-amp 241. If the difference exists, the difference will be amplified at the output of the op-amp 241. If no difference exists, the output of the op-amp 241 will be zero or null. In this sense, the op-amp 241 or current limiter module 240 can be adapted to determine a voltage sharing balance between the first SSPC 212 and the second SSPC 214.

Non-limiting aspects of the current limiter module 240 can further include a signal modifier 243 positioned at the output of the op-amp 241, and operable to receive the output of the op-amp 241. The signal modifier 243 can further be configured to receive a current limiting signal 242 from the switch control subcomponent 222 or controller module 220, representative or indicative of a requested or desired current limiting value, threshold, range, or the like. The signal modifier 243 can be configured to summate the op-amp 241 output and the current limiting signal 242 such that the summation updates or modifies the current limiting signal 242 (for example, when an op-amp 241 output exists or is not null). For instance, when a difference exists as an output from the op-amp 241, the current limiting signal 242 can be modified by the signal modifier 243 to provide a desired current limiting signal 242 to adjust or account for the difference. The desired current limiting signal 242 can then be further provided to a dynamic current limiting device 230, illustrated schematically, for limiting the output current of at least one of the set of SSPCs 216, shown as the first SSPC 212. In this sense, the first SSPC 212 is adapted to modify a current limiting characteristic of the first SSPC 212 in response to a determination that voltage sharing is unbalanced between the first SSPC 212 and the second SSPC 214.

One non-limiting function of the electrical power distribution system 200 can include protecting or protection against faults, such as short circuits and arc faults, in the electrical wiring interconnect system. Generally, there are two non-limiting examples of methods of dealing with short circuit conditions, overcurrent conditions, or a combination thereof, in SSPCs. The first method includes a "hard" trip threshold, wherein a satisfaction of a threshold value can be used to open the SSPC, such as when the output current exceeds a predetermined threshold level (i.e. a "hard" value). Hard trips are relatively straightforward to implement, but can result in unintended "nuisance trips" during switching on operations of the SSPC into reactive loads and during lightning events. The second method includes implementing a current limiting function to enable a soft-start for loads, and to control current to a manageable level during fault conditions, transient conditions, or a combination thereof.

However, current limiting in bipolar power distribution system 200, such as illustrated in FIG. 2 is problematic because there are two SSPCs with two independently-controlled current limit functions connected in series with the electrical load 226. The independent control of the current limit functions results in a small but significant mismatch in current limit thresholds between the two SSPCs due to, for instance, component tolerances. It is also not recommended to share a current limit between SSPCs due to separation or segregation requirements for both high voltage and fault considerations.

In the event of a short circuit across the electrical load 226, the current through the SSPCs 212, 214 will ramp up to the lower current limit threshold of the two SSPCs 212, 214. The SSPCs 212, 214 having the higher current limiter threshold will remain inactive (i.e. not actively, effectively, or operably limiting current through the SSPCs 212, 214), and the impedance of the SSPCs 212, 214 current limiter will be very low. This can result in a large voltage drop across the current limiter of the SSPCs 212, 214 having the lower current limit threshold, and very little voltage across the current limiter of the SSPCs 212, 214 having the higher current limit threshold.

When current limiting, the SSPCs 212, 214 experience a rapid temperature rise due to the high power dissipation created by the high current flowing through, and high voltage across the SSPCs 212, 214. This temperature rise can be determined, measured, estimated, or the like, within the switch control subcomponent 222, monitoring module 218, controller module 220, of combination thereof, of the respective SSPCs 212, 214, and the respective main solid-state switch 226 can be opened when this temperature value satisfies or exceeds a temperature threshold value, limit, or range. Thus, failure to adequately or sufficiently share voltage between the set of SSPCs 212, 214 during current limiting operations results in a faster trip time than that experienced in an equivalent unipolar distribution system under the same fault condition. While shorter trip times are beneficial for fault protection, the current limit function can also be used or utilized for controlled charging of capacitive loads, where the longer an SSPC 212, 214 can operate with current limiting functions without tripping, the larger the capacitive load that can be charged.

Thus, aspects of the disclosure can be included wherein the current limiter module 240 can operably or effectively allow for or enable current sharing between a set of SSPCs 216 during current limiting operations. During operation of the power distribution system 200, the first SSPC 212 and the second SSPC 214 can perform current sharing between them to effectively allocate, balance, share, or distribute the current or current limiting functions, as described herein.

If the output from the op-amp 241 goes positive, then there is more voltage dropped across the second SSPC 214 than the first SSPC 212. The op-amp 241 output can then be provided to the signal modifier 243 to modify the desired current limiting signal 242 provided to the current limiting device 230 of the first SSPC 212. In response to the desired current limiting signal 242 of this scenario, the current limiting device 230 can reduce the current limiting value provided (e.g. increase the amount of current limiting), to put the voltage drop across the first SSPC 212 in line, or closer in line, with that of the second SSPC 214. In one non-limiting example, the reduction of the current limiting value provided can include reducing the current limiting set point or another current limiting value.

If the output from op-amp 241 goes negative, then there is more voltage dropped across the first SSPC 212 than the second SSPC 214. The op-amp 241 output can then be provided to the signal modifier 243 to modify the desired current limiting signal 242 provided to the signal modifier 243 to modify the desired current limiting signal 242 provided to the current limiting device 230 of the first SSPC 212. In response to the desired current limiting signal 242 of this scenario, the current limiting device 230 can increase the current limiting value provided (e.g. reduce the amount of current limiting), to put the voltage drop across the first SSPC 212 in line, or closer in line, with that of the second SSPC 214. In one non-limiting example, the increasing of the current limiting value provided can include increasing the current limiting set point or another current limiting value.

Thus, aspects of the disclosure enables, allows for, or operably results in voltage sharing between the set of SSPCs 216 and therefore increases the available trip time, which in turn increases the capacitive load that can be charged.

While a schematic representation of the current limiter module 240 is illustrated, it will be appreciated that the operation, functionality, or instructions generated therein can be an effective or operable output of a number of logic devices, executable instruction sets, or the like. Thus, aspects of the disclosure or the current limiter module 240 are not so limited to only those aspects depicted or described herein. Additionally, in another non-limiting aspect, current-limiting functions of the SSPCs 212, 214 can be implemented in a control scheme requested or operated in response to the current limiting signal 242, and can include, but are not limited to merely switching patterns, operations, or the like. Furthermore, while the illustrated example shows the current limiter module 240 effectively limiting the current at the first SSPC 212, non-limiting aspects of the disclosure can be included wherein the current is limited in another of the set of SSPCs 216 (e.g. the second SSPC 214), or in at least a subset of the set of SSPCs 216. Furthermore, non-limiting aspects of the disclosure can be included wherein the current limiter module 240 can be located remote from the set of SSPCs 216.

In yet another non-limiting aspect of the disclosure, the current limiter module 240, switch control subcomponent 222, controller module 220, or combination thereof, can be included wherein a negative current limiter voltage value (i.e. the voltage across the second SSPC 214 or non-current limited SSPC) can be included, defined, designed, expected, or otherwise implemented as consistently less than the positive current limiter voltage value (i.e. the voltage across the first SSPC 212 or current limited SSPC) by a small amount, such that the voltage sharing circuit or the current limiter module 240 is expected to control current limiting functions over a very small range of current in order to compensate for the small (and expected) error between the respective positive and negative current limiter voltage values or thresholds. Stated another way, the current limiter module 240 can be designed or operable such that first SSPC 212 is expected to have a different power-providing value compared with the second SSPC 214, that is, wherein the current sharing is not precisely equal. The different power-providing value compared with the second SSPC 214 can be represented as a bias value, or the like, and a desired, imbalanced, or unbalanced amount of voltage dropped by, for example, the first SSPC 212, can be negated by the bias.

In yet another non-limiting aspect of the disclosure, the output from the op-amp 241 can be provided directly to the switch control subcomponent 222, the monitoring module 218, the controller module 220, or a combination thereof. In this example, the switch control subcomponent 222, the monitoring module 218, the controller module 220, or a combination thereof can receive the output, and generate the current limiting signal 242 in response to the output. As shown, yet further non-limiting aspects can be included wherein the power distribution systems can include a set of current sensors 246 located about the system 200, the set of SSPCs 216, or the like, and wherein the set of current sensors 246 can provide a current value input to the switch control subcomponent 222, the monitoring module 218, the controller module 220, or a combination thereof. In this sense, the switch control subcomponent 222, the monitoring module 218, the controller module 220, or a combination thereof, can execute instructions, or generate control signal outputs in response to the current values, for instance, received from strategic locations about the set of SSPCs 216 or power distribution system 200.

In yet another non-limiting aspect of the disclosure, a voltage sensor 248 can be disposed across the main solid-state switch 224, and operable to provide a voltage value across the main solid-state switch 224 to, for instance, the switch control subcomponent 222, the monitoring module 218, the controller module 220, the current limiter module 240, or a combination thereof. In this example, a voltage value received from the first SSPC 212 and the second SSPC 214 can be provided to the current limiter module 240 to be summated, and provided to the positive input terminal of the op-amp 241. The remaining disclosure operates similarly to the above-described examples.

Also as used herein, the terms "exceeds" or "satisfies" regarding a threshold value is used to mean that the respective value or values satisfy the predetermined threshold, such as being equal to or less than the threshold value, or being within the threshold value range. For example, if a sensed value falls below a minimum threshold, the value can "exceed" the threshold. It will be understood that such a determination may easily be altered to be satisfied by a positive/negative comparison, exceeding comparison, or a true/false comparison.

Figure 3:
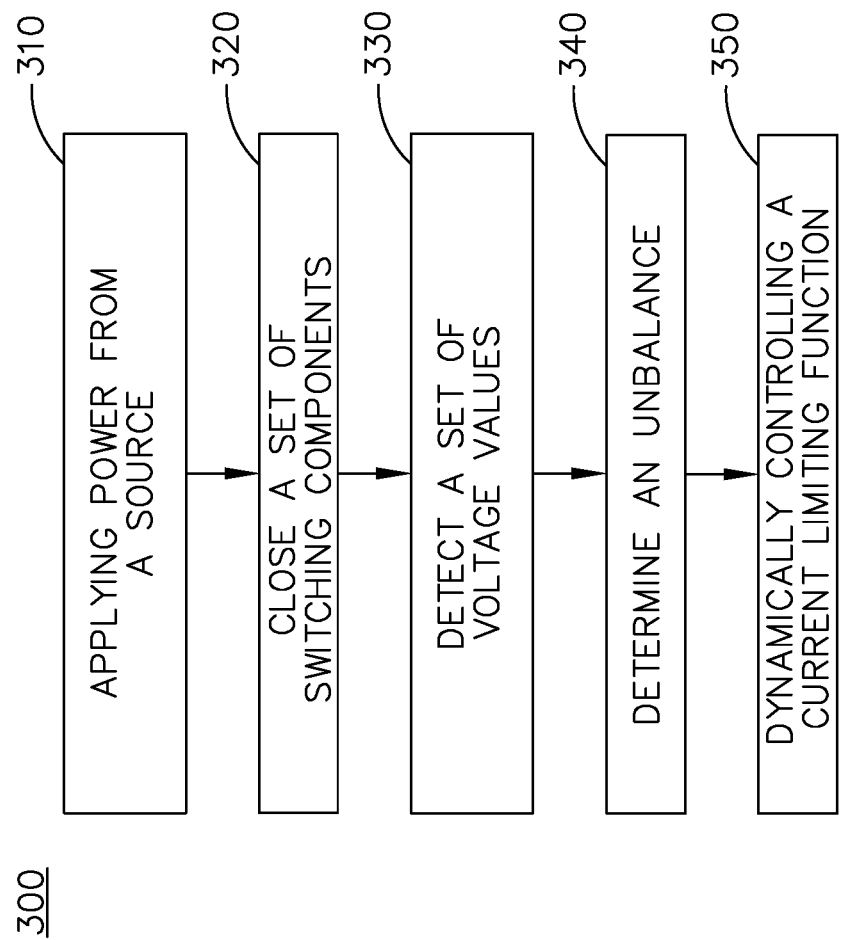
FIG. 3 is a flowchart illustrating a method of limiting current on the electrical power system of FIG. 2, in accordance with various aspects described herein.

FIG. 3 illustrates a flow chart demonstrating a method 300 of controlling voltage sharing between a set of switching components. The method 300 begins by applying power from a bipolar direct current (DC) source, such as power source 210, with a positive voltage lead and a negative voltage lead, at 310. Next, the method 300 includes closing the set of switching components 216 to connect power from the power source 210 to an electrical load 226, wherein the set of switching components 216 are in series with the electrical load 226, at 320. The method 300 continues by detecting a set of voltage values for the set of switching components 216, at 330. The method 300 then determines an imbalance between the voltage values for the set of switching components 216 in a current limiter module 240, at 340. Finally, the method 300 dynamically controls a current limiting function of at least one of the set of switching components 216 to correct the imbalance between the voltage values for the set of switching components 216, at 350.

Additional or alternative aspects of the method 300 can be included. For instance, in one non-limiting aspect determining the imbalance between the voltage values includes receiving a first voltage value from a first switching component 212, receiving a second voltage value from a second switching component 214, and comparing the first voltage value with the second voltage value at the current limiter module 240. In another non-limiting aspect, the method 300 can further include altering a current limiting control signal 242 proportional to the determined imbalance, and dynamically controlling the current limiting function of at least one of the set of switching components 216 by way of the altered current limiting control signal 242. In yet another non-limiting instance, determining an unbalance between the voltage values for the set of switching components 216 can include applying a bias value to at least one of the voltage values, and wherein the bias value is related to a desired power sharing ratio between the set of switching components 216.

The sequence depicted is for illustrative purposes only and is not meant to limit the method 300 in any way as it is understood that the portions of the method can proceed in a different logical order, additional or intervening portions can be included, or described portions of the method can be divided into multiple portions, or described portions of the method can be omitted without detracting from the described method.

Many other possible aspects and configurations in addition to that shown in the above figures are contemplated by the present disclosure.

The aspects disclosed herein provides a voltage sharing circuit for an electrical power distribution system. The technical effect is that the above described aspects enable the controlling of voltage, current, or power sharing between a set of switching components. A non-limiting advantage of the above-described aspects enables voltage sharing and increases the available trip time in the power distribution system. In another non-limiting advantage, the system described also provides a robust and cost-effective solution for current limiting in the power distribution system between solid-state switching devices arranged in series.

Yet another non-limiting advantage of the above described aspects can include utilizing solid-state switching devices compared with electro-mechanical switching devices. Typically, electro-mechanical switching devices or contactors are too slow to respond during short circuit or overcurrent conditions. Solid-state switching devices are orders of magnitude faster in such instances. Aspects of the disclosure can thus protect against faults in the electrical wiring interconnect system by way of current limiting operations described herein, while reducing nuisance trips and increasing the capacitive load that can be charged.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the described disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power distribution system, comprising:
    a bipolar direct current (DC) source with a positive voltage lead and a negative voltage lead;
    an electrical load capable of drawing electrical power from the bipolar DC source;
    a set of switching components configured to selectively connect power from the bipolar DC source to the electrical load by switching between an open state that disconnects power from the bipolar DC source to the electrical load and a closed state that connects power from the bipolar DC source to the electrical load, wherein a first switching component is connected to the positive lead of the bipolar DC source and a second switching component is connected to the negative lead of the bipolar DC source, and wherein each of the switching components includes a switch, a current limiting device, and a controller module; and
    a current limiter module connected with an output of the first switch of the first switching component and the output of the second switch of the second switching component, the current limiter module including a bias value related to at least one of the first switch or the second switch, and the current limiter module adapted to determine a voltage sharing balance between the first switch and the second switch;

wherein only the current limiting device of the first switching component is adapted to modify a current limiting characteristic in response to a determination that voltage sharing is unbalanced between the first switching component and the second switching component, by the current limiter module adjusting the control signal sent from the controller module to the current limiting device of the first switching component.

2. The power distribution system of claim 1 wherein the first switching component includes a dynamic current limiter.

3. The power distribution system of claim 2 wherein the dynamic current limiter is adapted to modify the current limiting characteristic of the dynamic current limiter in response to the determination that voltage sharing is unbalanced.

4. The power distribution system of claim 1 wherein the first switching component is adapted to modify the current limiting characteristic such that the voltage sharing is balanced between the first switch and the second switch.

5. The power distribution system of claim 1 wherein the current limiter module includes a summation of a first voltage value from the positive lead and a second voltage value from the negative lead.

6. The power distribution system of claim 5 wherein the summation is provided to a comparator module configured to generate an output representative of the voltage sharing balance.

7. The power distribution system of claim 6 wherein the output is positive when more voltage is dropped across the second switch, compared with the voltage dropped across the first switch.

8. The power distribution system of claim 6 wherein the output is at least one of zero or null when the voltages dropped across the first switch and second switch are equal.

9. The power distribution system of claim 1 wherein the bias value biases the summation such that an amount of voltage dropped by at least one of the first switch or second switch is negated by the bias.

10. The power distribution system of claim 1 wherein the bipolar DC source includes two 270 Volt DC power supplies.

11. The power distribution system of claim 10 wherein a negative lead of one of the two 270 volt direct current power supplies is coupled to a chassis ground and the positive lead of the other of the two 270 volt direct current power supplies is coupled to the chassis ground.

12. The power distribution system of claim 1 wherein the set of switching components includes two solid-state power controllers.

13. A power distribution system for an aircraft, comprising:
a bipolar direct current (DC) source with a positive voltage lead and a negative voltage lead;
an electrical load capable of drawing electrical power from the bipolar DC source;
a set of switching components configured to selectively connect power from the bipolar DC source to the electrical load by switching between an open state that disconnects power from the bipolar DC source to the electrical load and a closed state that connects power from the bipolar DC source to the electrical load, wherein a first switching component is connected to the positive lead of the bipolar DC source and a second switching component is connected to the negative lead of the bipolar DC source, and wherein each of the first switching component and the second switching component includes a switch, a current limiting device, and a controller module;
a first voltage sensor disposed across the first switch of the first switching component and adapted to sense the voltage dropped across the first switch and a second voltage sensor disposed across the second switch of the second switching component and adapted to sense the voltage dropped across the second switch; and
a current limiter module adapted to receive the voltage dropped across the first switch and the voltage dropped across the second switch, and adapted to determine a voltage sharing balance between the first switch and the second switch;
wherein only the current limiting device of the first switching component is adapted to modify a current limiting characteristic in response to a determination that voltage sharing is unbalanced between the first switching component and the second switching component, by the current limiter module adjusting the control signal sent from the controller module to the current limiting device of the first switching component.

14. The power distribution system of claim 13 wherein the current limiting device includes a dynamic current limiter.

15. The power distribution system of claim 14 wherein the dynamic current limiter is adapted to modify the current limiting characteristic of the dynamic current limiter in response to the determination that voltage sharing is unbalanced.

16. A method of controlling voltage sharing between a set of switching components, each of the set of switching components including a switch, a current limiting device, and a controller module, the method comprising:
applying power from a bipolar direct current (DC) source with a positive voltage lead and a negative voltage lead;
closing each of the switches of the set of switching components to connect power from the bipolar DC source to an electrical load, wherein the set of switching components are in series with the electrical load;
detecting a set of voltage values across the set of switching components;
determining an imbalance between the voltage values for the set of switching components in a current limiter module by applying a bias value to at least one of the voltage values, and wherein the bias value is related to a desired power sharing ratio between the set of switching components; and
dynamically controlling a current limiting device of only one of the set of switching components to correct the imbalance between the voltage values for the set of switching components, by the current limiter module adjusting the control signal sent from the controller module to the current limiting device of the only one of the set of switching components.

17. The method of claim 16 wherein determining the imbalance between the voltage values includes receiving a first voltage value from a first switching component, receiving a second voltage value from a second switching component, and comparing the first voltage value with the second voltage value at the current limiter module.

18. The method of claim 17, further comprising altering a current limiting control signal proportional to the determined imbalance, and dynamically controlling the current limiting device of at least one of the set of switching components by way of the altered current limiting control signal.

* * * * *